(12) United States Patent
Kim et al.

(10) Patent No.: US 6,828,611 B2
(45) Date of Patent: Dec. 7, 2004

(54) INTEGRATED CIRCUIT FERROELECTRIC MEMORY DEVICES INCLUDING PLATE LINES DIRECTLY ON FERROELECTRIC CAPACITORS

(75) Inventors: Hyun-Ho Kim, Kyunggi-do (KR); Ki-Nam Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/054,540

(22) Filed: Jan. 22, 2002

(65) Prior Publication Data

US 2002/0105017 A1 Aug. 8, 2002

(30) Foreign Application Priority Data

Feb. 2, 2001 (KR) .......................................... 2001-5147

(51) Int. Cl.[7] ....................... H01L 27/108; H01L 29/76; H01L 29/94; H01L 31/119
(52) U.S. Cl. ..................... 257/296; 257/303; 257/306
(58) Field of Search ................................ 257/295, 296, 257/303, 306, 308, 310; 438/239, 240, 241, 253, 254, 396, 397, 398

(56) References Cited

U.S. PATENT DOCUMENTS

| 5,495,117 | A | * | 2/1996 | Larson | 257/295 |
| 5,698,463 | A | * | 12/1997 | Suga | 438/253 |
| 5,774,327 | A | * | 6/1998 | Park | 361/321.5 |
| 6,271,084 | B1 | * | 8/2001 | Tu et al. | 438/253 |
| 6,326,315 | B1 | * | 12/2001 | Uchiyama et al. | 438/758 |
| 6,388,281 | B1 | * | 5/2002 | Jung et al. | 257/295 |

* cited by examiner

*Primary Examiner*—Hoai Pham
(74) *Attorney, Agent, or Firm*—Myers Bigel Sibley & Sajovec, P.A.

(57) ABSTRACT

Integrated circuit ferroelectric memory devices are provided that include an integrated circuit transistor. The memory device further includes a ferroelectric capacitor on the integrated circuit transistor. The ferroelectric capacitor includes a first electrode adjacent the transistor, a second electrode remote from the transistor and a ferroelectric film therebetween. The memory device further includes a plate line directly on the ferroelectric capacitor. Methods are also provided that include forming a ferroelectric capacitor on the integrated circuit transistor and forming a plate line directly on the ferroelectric capacitor.

9 Claims, 8 Drawing Sheets

US 6,828,611 B2

INTEGRATED CIRCUIT FERROELECTRIC MEMORY DEVICES INCLUDING PLATE LINES DIRECTLY ON FERROELECTRIC CAPACITORS

RELATED APPLICATION

This application is related to Korean Application No. 2001-05147, filed Feb. 2, 2001, the disclosure of which is hereby incorporated herein by reference.

FIELD OF THE INVENTION

The present invention relates to integrated circuit memory devices and methods of fabricating the same and, more particularly, to integrated circuit ferroelectric memory devices and methods of fabricating the same.

BACKGROUND OF THE INVENTION

Integrated circuit memory devices can be classified into two categories, volatile memory devices and non-volatile memory devices. Non-volatile memory devices, for example, flash memory, magnetic tape and/or magnetic floppy disks, can maintain stored data when the power supply to the memory device is blocked.

In contrast, volatile memory devices may lose stored data when the power supply to the memory device is blocked. Volatile memory devices may include, for example, static random access memory (SRAM) and/or dynamic random access memory (DRAM). Although DRAM devices may be highly integrated using a transistor and capacitor memory cell arrangement, these devices may require a periodic refresh operation in order to maintain stored data when the power supply to the memory device is blocked.

It may be possible to use a capacitor memory cell of a DRAM structure when a ferroelectric material is formed between two electrodes of the capacitor, such as in, for example, a ferroelectric random access memory (FRAM) device. FRAM devices may exhibit characteristics of non-volatile memory devices due to the ferroelectric material between a pair of capacitor electrodes. Thus, a FRAM device has two different stable polarization states. The two polarization states are typically inverted according to the direction of the applied voltage and the inverted polarization states are typically maintained when the applied voltage is blocked.

A FRAM device may be non-volatile. FRAM devices are typically programmable with a low voltage, for example, less than about 5V, have less than about a 40 nanosecond access time, and have a robustness with respect to virtually unlimited numbers of read/write cycles, for example, more than about $1 \times 10^{12}$ cycles. Flash memory devices are typically programmable with voltages from about 18V to about 22V, have access times of about a couple of microseconds, and a robustness with respect to from about $1 \times 10^5$ to about $1 \times 10^6$ cycles. FRAM devices also typically do not consume a lot of power and exhibit radiation hardness.

Now referring to FIGS. 1 and 2, typical equivalent circuits of ferroelectric memory devices will be discussed. As shown in FIG. 1, a two transistor/two capacitor (2T/2C) ferroelectric memory device 10 includes a first transistor T1 coupled to a first ferroelectric capacitor CF1 and a second transistor T2 coupled to a second ferroelectric capacitor CF2. The first and second ferroelectric capacitors CF1 and CF2 store complementary polarization states. The complementary polarization states define a single data state. A plate line PL is coupled to one side of the first and second ferroelectric capacitors CF1 and CF2 and runs parallel to a word line WL that is coupled to the gates of the first and second transistors T1 and T2. A pair of complementary bit lines BL and BL' are coupled to one side of the first and second transistors T1 and T2.

As illustrated in FIG. 2, a one transistor/one capacitor (1T/1C) ferroelectric memory device 20 includes one transistor T and one ferroelectric capacitor CF coupled to one terminal (one of a source region and a drain region) of the transistor T. One word line WL is coupled to a gate of the transistor T and one bit line BL is coupled to the other terminal (the other of the source region and the drain region) of the transistor T and a respective plate line PL is coupled to a second electrode of the ferroelectric capacitor CF.

In the equivalent circuits of FIGS. 1 and 2, an electrical pulse may be applied to a second electrode of the ferroelectric capacitor to trigger a data read/write operation. To enable the data read/write operation, a plate line is formed such that it is electrically connected to the second electrode through a contact hole as described with respect to FIG. 3.

Now referring to FIG. 3, methods of fabricating conventional ferroelectric memory devices will be described. A contact plug 302 is formed in a contact hole in a first insulating layer 300. The contact plug 302 is electrically connected to one of the source region and/or the drain region of a transistor in an underlying substrate. A ferroelectric capacitor CF is formed on the first insulating layer 300 and is electrically connected to the contact plug 302. The ferroelectric capacitor CF typically includes a first electrode 304, a ferroelectric film 306 and a second electrode 308. A second insulating layer 310 is typically formed on the ferroelectric capacitor CF and on the first insulating layer 300. A plate line 314 is formed on the second insulating layer 310 and is electrically connected to the second electrode 308. The plate line 314 is formed by the steps of patterning the second insulating layer 310 to form a contact hole 312 that exposes the second electrode 308, depositing a plate line conductive material on the second insulating layer 310 and in the contact hole 312, and patterning the deposited conductive material to form the plate line 314.

As integrated circuit memory devices decrease in size, the contact holes may also become smaller and the insulating layer over the ferroelectric capacitor may become thicker. As a result, a photo-etching process used to interconnect the second electrode and the plate line may become more difficult to perform accurately. For example, when a small contact hole is formed in a thick insulating layer, the contact hole may be incompletely opened and/or a reliable contact resistance between the plate line and the second electrode may not be secured. Furthermore, if a stripe line is formed to improve a conductivity of the word line, an electrical bridge between the stripe line and the plate line may occur if the contact hole is misaligned.

SUMMARY OF THE INVENTION

Embodiments of the present invention provide integrated circuit ferroelectric memory devices including integrated circuit transistors. The memory device further includes a ferroelectric capacitor on the integrated circuit transistor. The ferroelectric capacitor includes a first electrode adjacent the transistor, a second electrode remote from the transistor and a ferroelectric film therebetween. The memory device still further includes a plate line directly on the ferroelectric capacitor.

In some embodiments of the present invention the plate line may be directly on the second electrode of the ferroelectric capacitor. The integrated circuit ferroelectric memory device may be free of a plug between the plate line and the second electrode. The integrated circuit ferroelectric memory device may further be free of an insulating layer between the plate line and the second electrode. Furthermore, the second electrode may have a width and the plate line may be directly on the second electrode across the width.

In further embodiments of the present invention a stripe line may be provided adjacent the second electrode and remote from the first electrode. Alternatively, a stripe line may be provided between the second electrode and the transistor. The stripe line may include aluminum.

In still further embodiments of the present invention the first electrode may include at least one of platinum and/or iridium dioxide. The ferroelectric film may include at least one of PZT, SBT and/or BLT. The second electrode may include at least one of iridium, ruthenium, platinum and/or iridium dioxide.

Some embodiments of the present invention include methods of fabricating integrated circuit ferroelectric memory devices, including forming an integrated circuit transistor. These embodiments further include forming a ferroelectric capacitor on the integrated circuit transistor. The ferroelectric capacitor includes a first electrode adjacent the transistor, a second electrode remote from the transistor and a ferrolectric film therebetween. These embodiments still further include forming a plate line directly on the ferroelectric capacitor.

In further embodiments of the present invention forming the ferroelectric capacitor may include forming a first electrode layer on the transistor, forming a ferroelectric layer on the first electrode layer, forming a second electrode layer on the ferroelectric layer, and etching the first electrode layer, the ferroelectric layer and the second electrode layer to form the first electrode, the ferroelectric film and the second electrode, respectively.

In still further embodiments of the present invention forming the plate line may include forming an insulating layer on the ferroelectric capacitor, planarizing the insulating layer to expose at least a portion of the second electrode, forming a plate line conductive layer on the second electrode and the insulating layer and etching the plate line conductive layer to form the plate line directly on the second electrode of the ferroelectric capacitor.

DETAILED DESCRIPTION OF EMBODIMENTS OF THE PRESENT INVENTION

Figure 1:
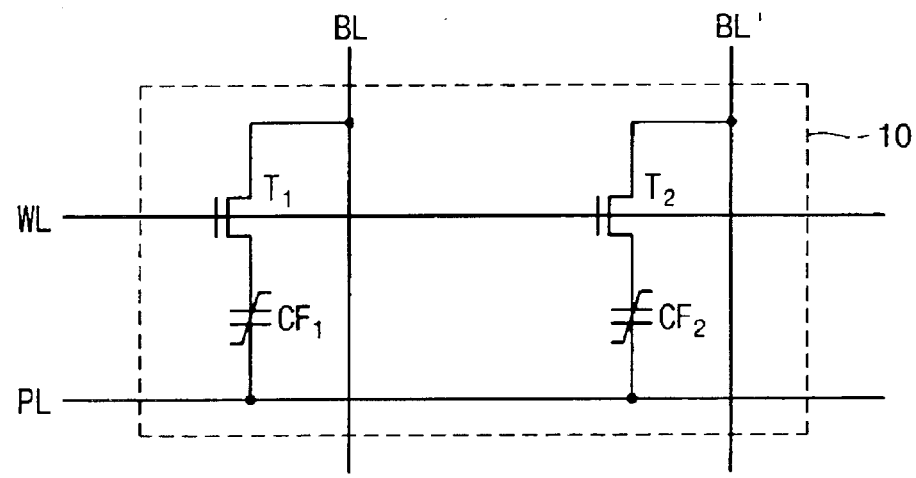
FIG. 1 is a circuit diagram illustrating a typical equivalent circuit of 2T/2C ferroelectric memory device.
Figure 2:
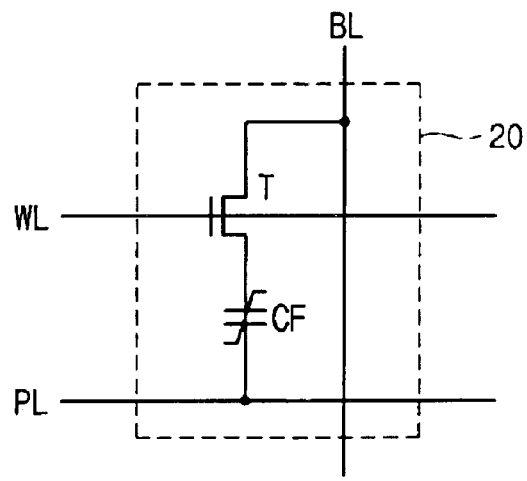
FIG. 2 is a circuit diagram illustrating a typical equivalent circuit of a 1T/1C ferroelectric memory device.
Figure 3:
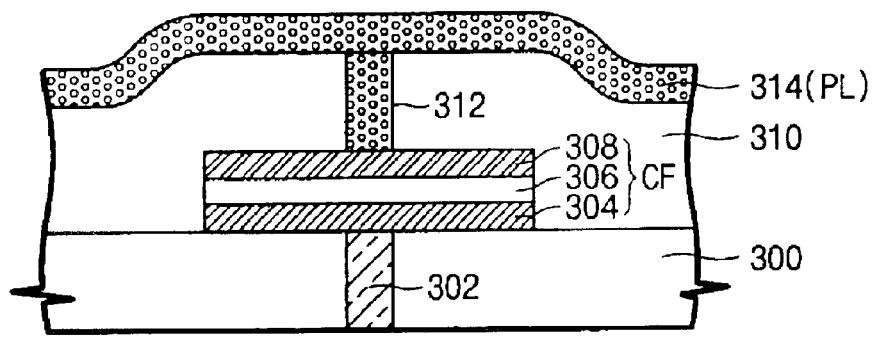
FIG. 3 is a cross-sectional view a conventional ferroelectric memory device.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when a layer is referred to as being "directly on" another layer, there are no intervening layers present. Also, when a layer is referred to as being "connected" or "coupled" to another layer, it can be directly connected or coupled to the other layer or intervening layers may be present. In contrast, when a layer is referred to as being "directly connected" or "directly coupled" to another layer, there are no intervening layers present. Like reference numerals refer to like elements throughout.

Embodiments of the present invention will now be described in detail below with reference to FIGS. 4 through 15, which illustrate various embodiments of the present invention and various fabrication processes according to embodiments of the present invention. An integrated circuit device is provided having a ferroelectric capacitor disposed on a transistor. The ferroelectric capacitor includes a first electrode, a second electrode and a ferroelectric film and a plate line is disposed directly on the ferroelectric capacitor. Thus, embodiments of the present invention may provide advantages over conventional ferroelectric capacitors by allowing reduced contact resistance between the plate line and the second electrode and reducing or eliminating the problems associated with having a smaller, deeper contact hole that electrically connects the second electrode and the plate line.

Figure 4:
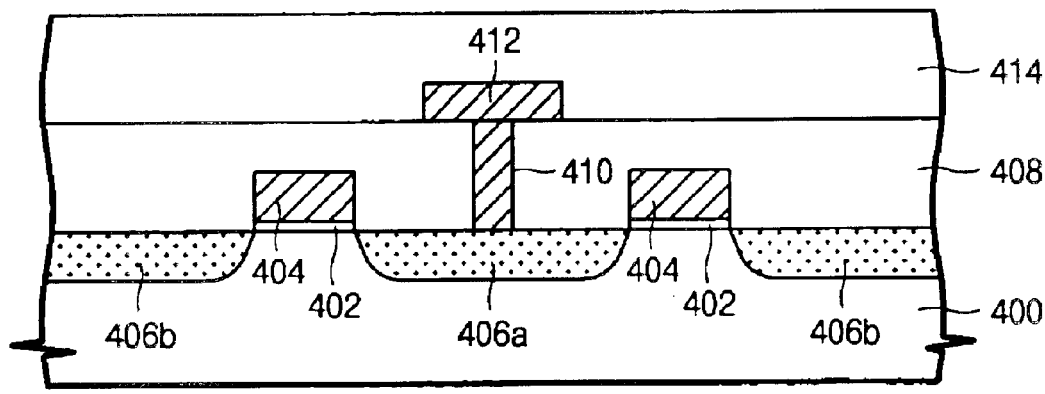
FIGS. 4 through 11 are cross-sectional views of integrated circuits according to embodiments of the present invention during intermediate fabrication steps according to embodiments of the present invention.

Integrated circuit ferroelectric memory devices including plate lines directly on ferroelectric capacitors and related fabrication processes according to embodiments of the present invention will now be described further with respect to FIGS. 4 through 11, which are cross-sectional views of integrated circuits according to embodiments of the present invention during intermediate fabrication steps according to embodiments of the present invention. Referring now to FIG. 4, an active region is defined through a device isolation process on an integrated circuit substrate 400. A conventional complementary metal oxide semiconductor field effect transistor (CMOSFET) process is carried out to form a transistor on the integrated circuit substrate 400. The transistor includes a gate electrode 404 and source/drain regions 406a and 406b in the integrated circuit substrate 400 outside of the gate electrode 404. The gate electrode 404 is insulated from the integrated circuit substrate 400 by a gate insulating layer 402. In particular, a gate insulating layer 402 is formed on the integrated circuit substrate 400. A gate electrode conductive layer is formed on the gate insulating layer 402, for example, an oxide layer. The gate electrode layer is patterned to form a plurality of gate electrodes 404, i.e. gate lines.

It will be understood that although only two gate electrodes 404 are shown in FIG. 4, the present invention should not be limited to this configuration. For example, a single gate electrode 404 may be provided. Alternatively, three or more gate electrodes 404 may be provided. Furthermore, the gate electrode 404 may include, for example, polysilicon, tungsten and/or tungsten silicide. The gate electrode 404 may serve as, for example, a word line. A conventional ion implantation process may be carried out to form the source/drain regions 406a and 406b in the integrated circuit substrate 400 outside of the gate electrode 404, thereby completing the transistor.

A first insulating layer 408 is formed on the transistor and the integrated circuit substrate 400. The first insulating layer 408 may include, for example, a borophosphosilicate glass (BPSG) layer. The first insulating layer 408 is patterned to form a bit line contact hole 410 that exposes at least part of one of the source region and/or drain region 406a. A bit line conductive layer is deposited on the first insulating layer 408 and in the bit line contact hole 410. The bit line conductive layer is patterned to form a bit line 412. Alternatively, a bit line contact plug may be formed in the contact hole 410 and a bit line may be electrically connected to the bit line contact plug. The bit line 412 may include, for example, tungsten. A second insulating layer 414 is formed on the bit line 412 and on the first insulating layer 408. For example, the second insulating layer 414 can be formed of BPSG layer.

Figure 5:
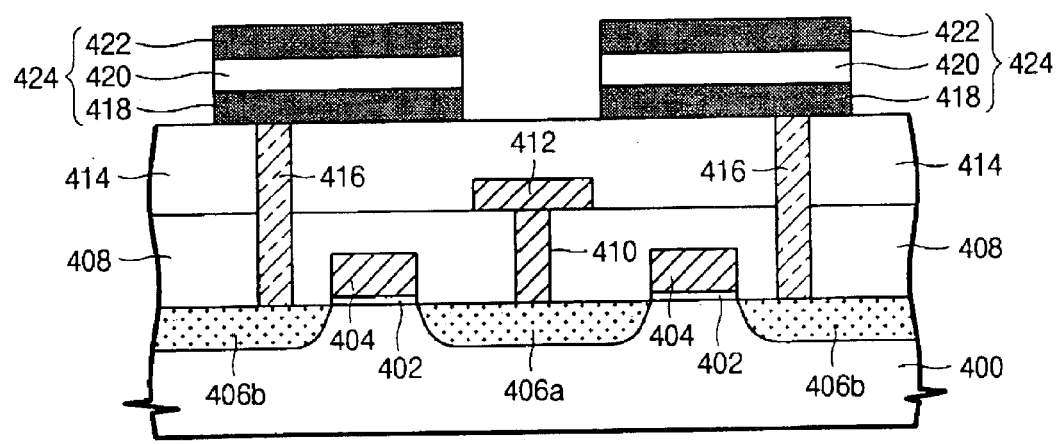

Referring now to FIG. 5, the second insulating layer 414 and the first insulating layer 408 are patterned to form a capacitor contact hole that exposes at least a portion of one of the source region and/or drain region 406b. A conductive material, such as polysilicon, is formed on the second insulating layer 414 and in the contact hole. The conductive material is planarized to form a capacitor contact plug 416. The planarization of the conductive material and the second insulating layer 414 may be performed at approximately the same time. In other words, the capacitor contact plug 416 may be formed at approximately the same time as the planarization of the second insulating layer 414. The planarization of the second insulating layer 414 may provide a surface topology suitable for subsequent dielectric film deposition, thereby obtaining a substantially uniform ferroelectric film thickness.

A ferroelectric capacitor 424 is formed and is electrically connected to the contact plug 416. In particular, a first electrode layer is formed, for example, deposited, on the second insulating layer 414 including the contact plug 416, a ferroelectric layer is formed on the first electrode layer, and a second electrode layer is formed on the ferroelectric layer. The layers are patterned to form the ferroelectric capacitor 424 including a first electrode 418, a ferroelectric film 420, and a second electrode 422 as illustrated in FIG. 5. The first electrode 418 of the ferroelectric capacitor 424 is electrically connected to the contact plug 416. The first electrode 416 may include, for example, a conductive metal such as platinum and/or a conductive oxide electrode, such as iridium dioxide. The ferroelectric film 420 may include, for example, PZT, SBT and/or BLT. For example, a ferroelectric film including PZT may be formed by depositing a precursor material by a sol-gel method and annealing the deposited material. The second electrode 422 may include, for example, a conductive metal, such as iridium, ruthenium and/or platinum and/or a conductive oxide electrode, such as iridium dioxide.

It will be understood that the fabrication of the transistor and ferroelectric capacitor discussed above with respect to FIGS. 4 and 5 is well known to those having skill in the art and will not be discussed further herein. It will also be understood that many other structures, processes and/or materials for the transistor and/or ferroelectric capacitors of FIGS. 4 and 5 are known to those having skill in the art, thus, the structures, processes and/or materials for the transistor and/or ferroelectric capacitors according to embodiments of the present invention should not be limited to those discussed above with respect to FIGS. 4 and 5.

Figure 6:
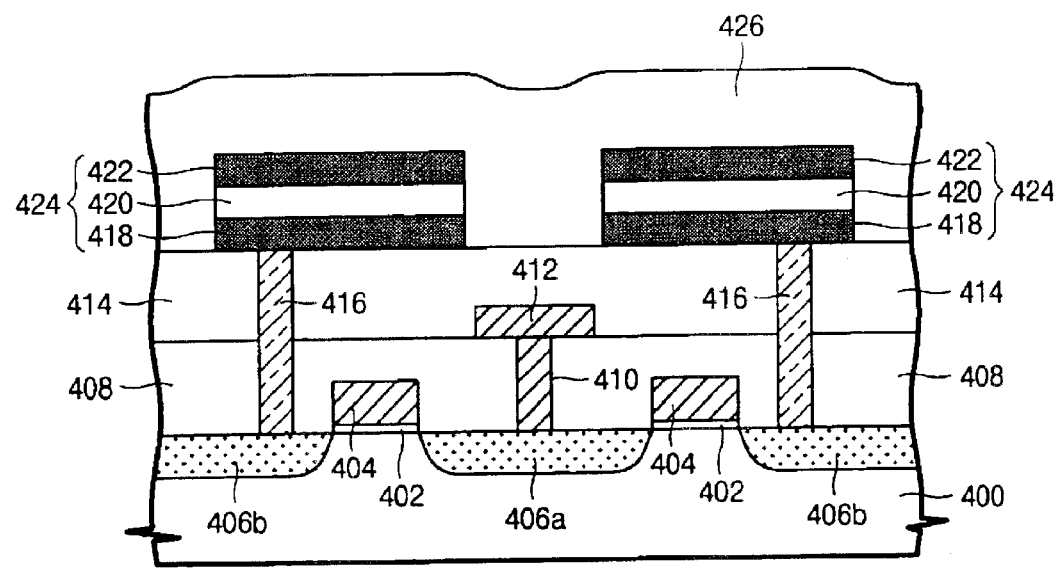

Referring now to FIG. 6, a third insulating layer 426 is formed on the ferroelectric capacitor 424 and on the second insulating layer 414. The third insulating layer 426 may include undoped silicate glass (USG), phosphorous silicate glass (PSG) and/or plasma enhanced tetraethylorthosilicate glass (PE-TEOS). It will be understood that combinations of different kinds of insulating layers can also be used.

Figure 7:
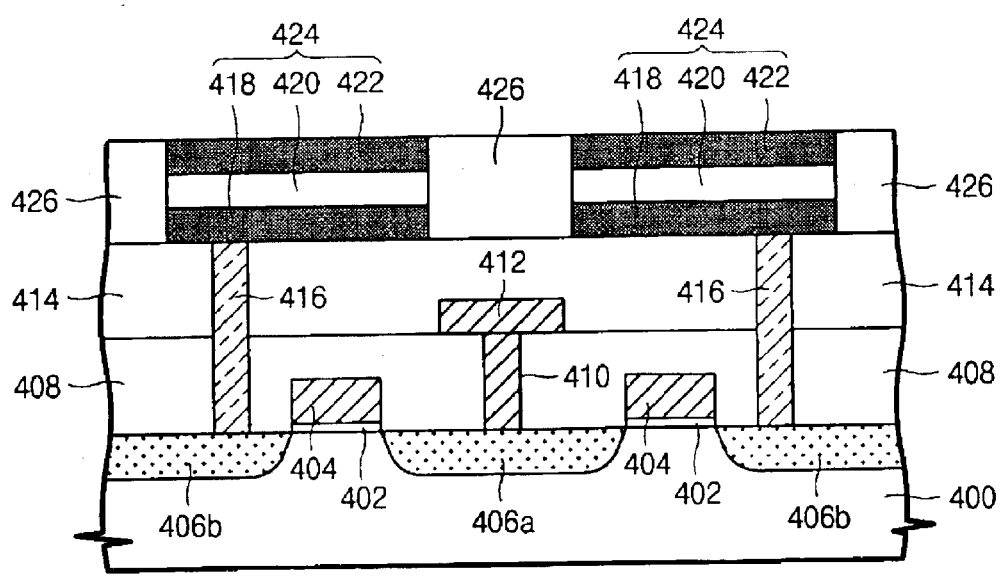

Referring now to FIG. 7, a planarization process is carried out on the third insulating layer 426 that exposes at least a portion of the second electrode 422. For example, a top surface of the second electrode 422 may have substantially the same level as a top surface of the third insulating layer 426. The planarization process may be carried out by a CMP and/or an etch-back method. Argon sputtering can be further carried out to clean the surface of the second electrode 422, thereby possibly improving the characteristics of the contact resistance between the second electrode and a plate line discussed below.

Figure 8:
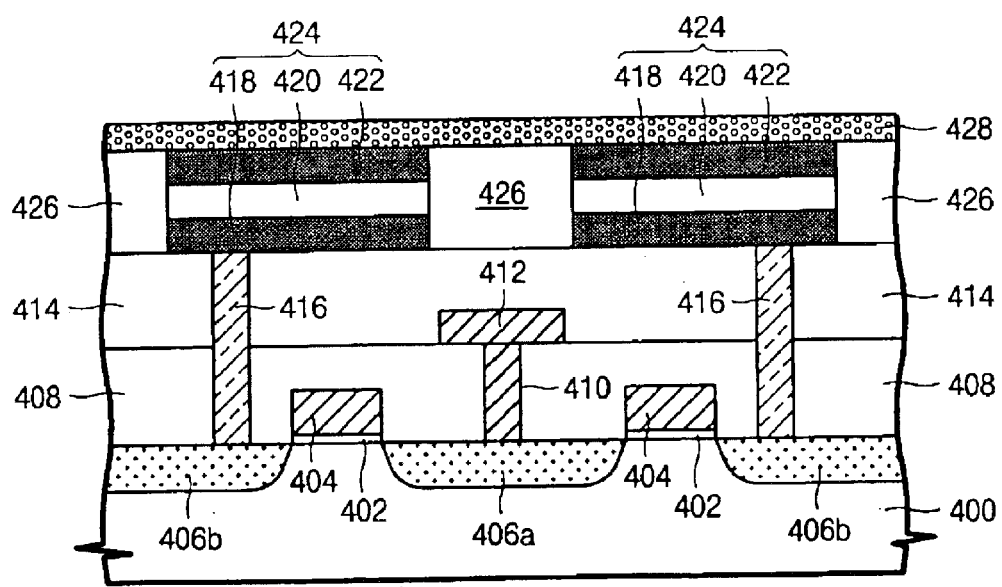

Referring now to FIG. 8, a plate line conductive layer 428 is formed directly on the exposed portion of the second electrode 422 and on the third insulating layer 426. The plate line conductive layer 428 may include, for example, any conductive material, such as aluminum. If aluminum is selected as the conductive material, a sputtering technique may be employed advantageously, since the topology of underlying structure is flat. Accordingly, a high temperature treatment performed in a reflow process, typically used during fabrication of conventional devices, may be avoided since a contact hole is not formed to electrically connect the plate line and the second electrode. During fabrication of a conventional device, deep and narrow contact holes are formed in an insulator formed on a second electrode of a ferroelectric capacitor. Thus, aluminum deposition and a subsequent high temperature anneal are typically performed to improve the filling characteristics of the contact hole. A Ferroelectric film already present on the conventional device may be degraded during the high temperature anneal.

Figure 9:
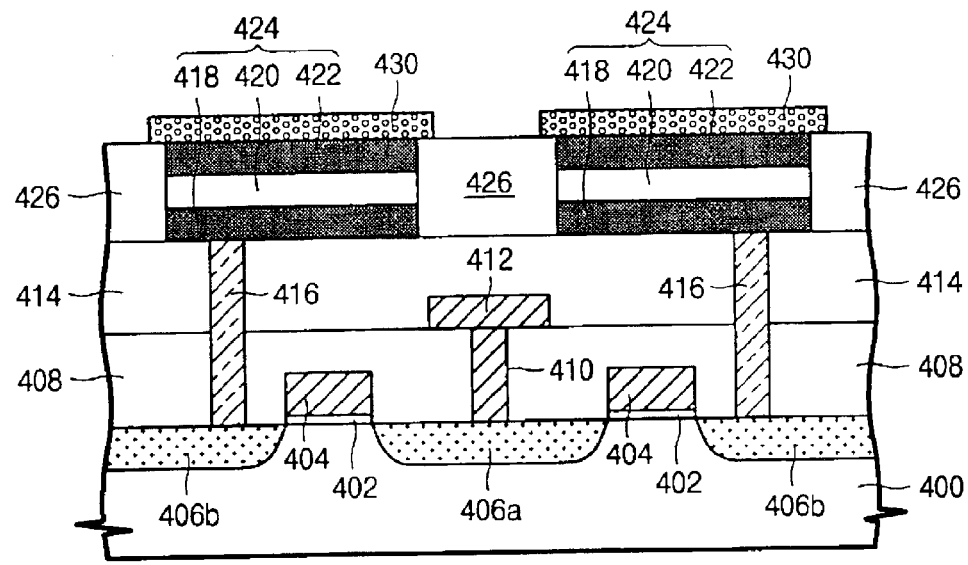

Referring now to FIG. 9, the plate line conductive layer 428 is patterned to form a plate line 430 that is directly in contact with the second electrode 422, thus allowing some or all of the problems associated with conventional devices discussed above to be reduced or possibly eliminated. Thus, some ferroelectric memory devices according to embodiments of the present invention are free of a contact hole and a plug between the plate line and the second electrode of the ferroelectric capacitor for electrically connecting the plate line to the ferroelectric capacitor as discussed above with respect to the prior art. Moreover, in some embodiments of the present invention, the plate line extends directly on second electrode across the entire width of the second electrode.

Figure 10:
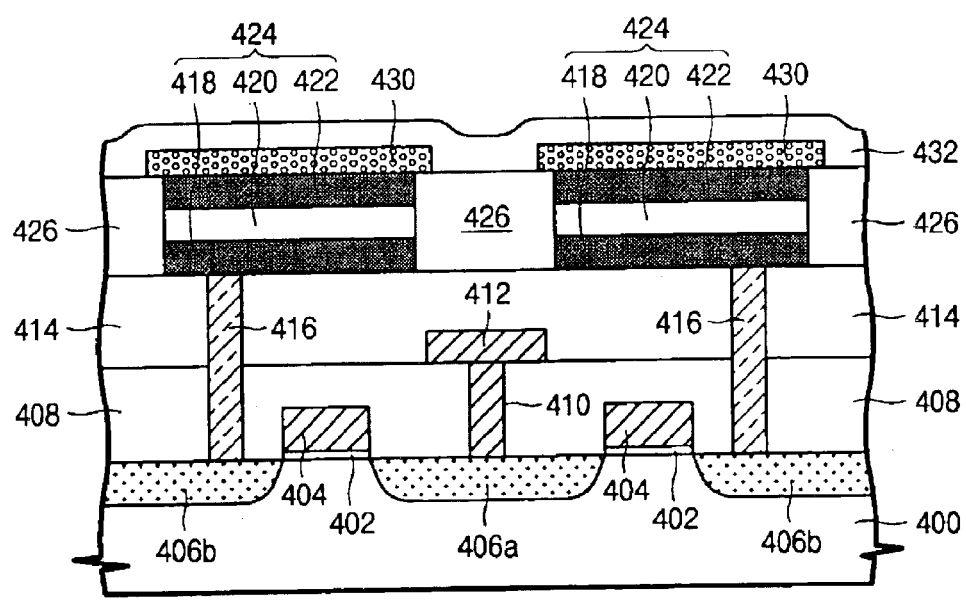
Figure 11:
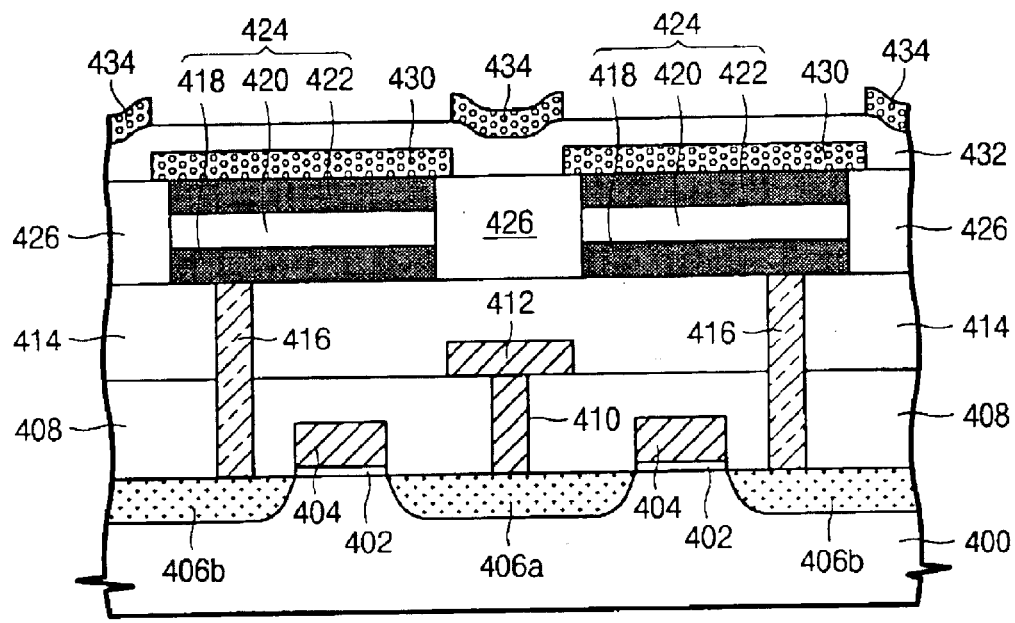

As illustrated in FIGS. 10 and 11, an optional stripe line process may be performed. The stripe line may be formed to improve conductivity of the gate line, i.e., a word line. In particular, as shown in FIG. 10, an inter-metal insulating layer 432 may be formed on the plate line 430. The inter-metal insulating layer 432 may include, for example, USG, PSG and/or PE-TEOS. The inter-metal insulating layer 432, the third insulating layer 426, the second insulating layer 414 and the first insulating layer 408 are patterned to form a hole that exposes at least a selected portion of the gate line. A conductive material, such as aluminum, is formed in the hole and the conductive material is patterned to form the stripe line 434, as illustrated in FIG. 11. The stripe line 434 is offset from the ferroelectric capacitor 424 as illustrated in FIG. 11.

Figure 12:
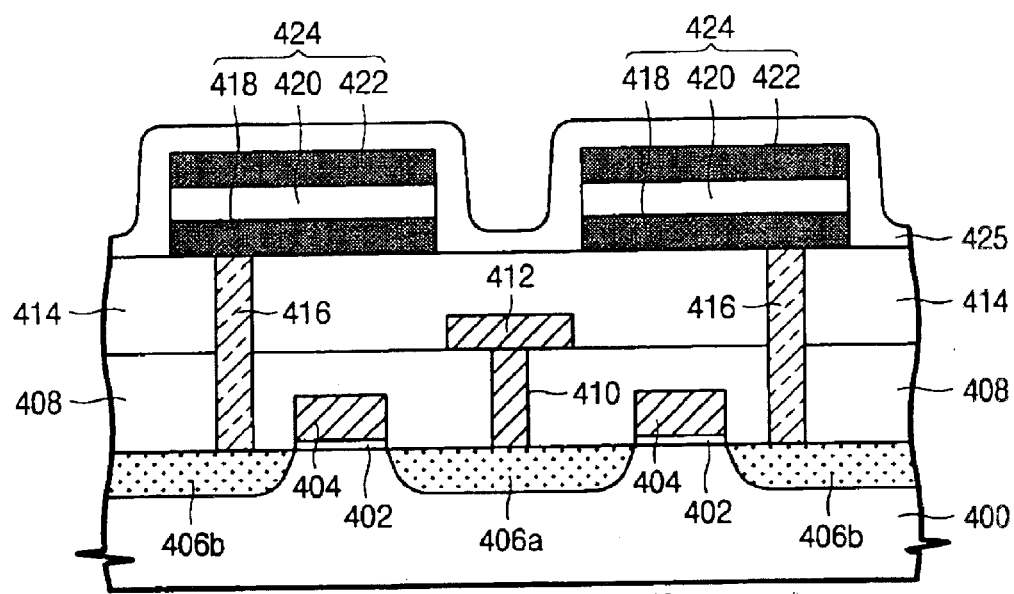
FIGS. 12 through 15 are cross-sectional views of integrated circuits according to further embodiments of the present invention during intermediate fabrication steps according to further embodiments of the present invention.

Alternatively, the stripe line may be formed below a surface of the ferroelectric capacitor 424 as illustrated in FIGS. 12 to 15. Referring now to FIG. 12, after forming a ferroelectric capacitor 424 as illustrated in FIG. 5, a conformal insulating layer 425 is formed on the ferroelectric capacitor 424 and on the second insulating layer 414.

Figure 13:
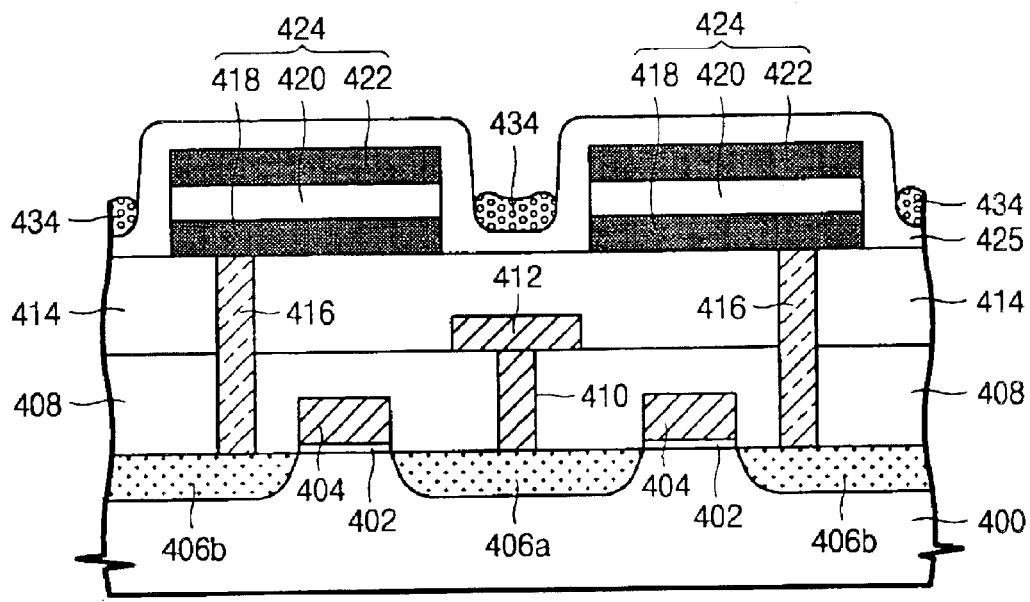

Referring now to FIG. 13, the conformal insulating layer 425, the second insulating layer 414 and the first insulating layer 408 are patterned to form a hole that exposes at least a selected portion of the gate line. A conductive material is formed and patterned to form a stripe line 434. A top surface of the stripe line 434 is at least lower than a top surface of the ferroelectric capacitor 424.

Figure 14:
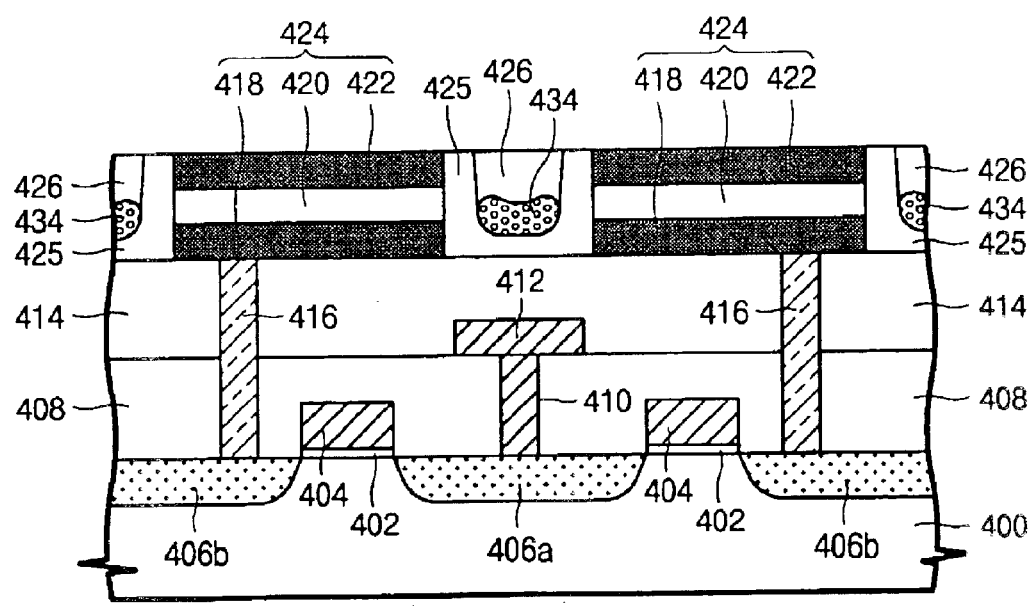

Referring now to FIG. 14, a third insulating layer 426 is formed on the ferroelectric capacitor, the stripe line 434 and the conformal insulating layer 425. The third insulating layer 426 is planarized until at least a portion of the second electrode 422 is exposed.

Figure 15:
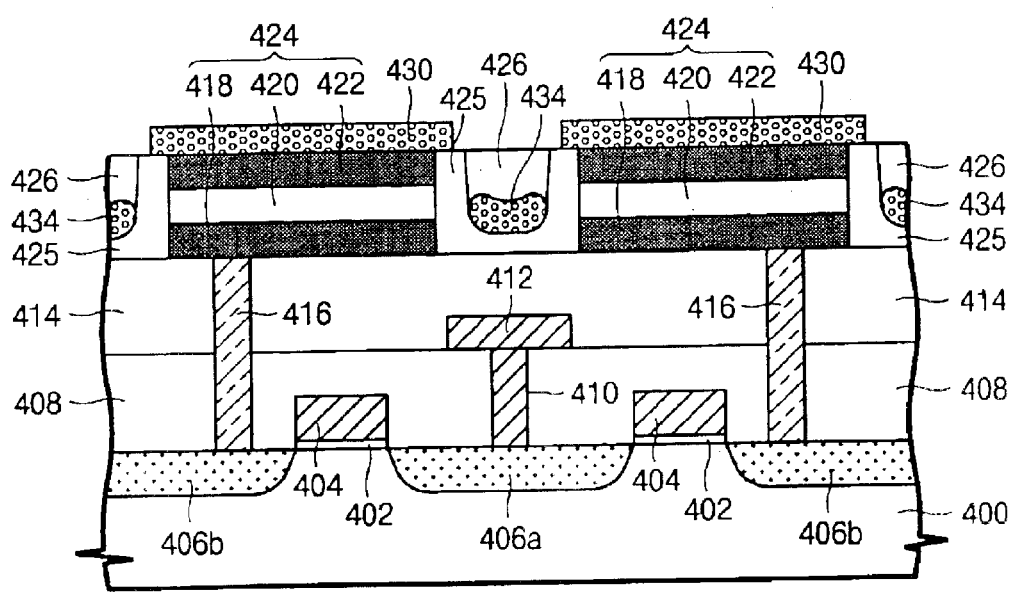

Referring now to FIG. 15, a conductive material is formed directly on the third insulating layer 426 and on the second electrode 422 and patterned to form a plate line 430. Thus, an electrical bridge between the plate line 430 and the stripe line 434 may be avoided.

As described above, embodiments of the present invention can provide an integrated circuit having a plate line that is in direct contact with a second electrode of a ferroelectric capacitor. The contact area between the plate line and the second electrode may be increased compared to the conventional contact structure, thereby allowing reduced contact resistance between the plate line and the second electrode of the ferroelectric capacitor. Thus, embodiments of the present invention may provide advantages over conventional ferroelectric capacitors by lowering the contact resistance between the plate line and the second electrode and reducing or eliminating the problems associated with having a smaller, deeper contact hole that electrically connects the second electrode and the plate line.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit ferroelectric memory device, comprising:

an integrated circuit transistor having a source region and a drain region;

a ferroelectric capacitor on the integrated circuit transistor having first and second sidewalls, the ferroelectric capacitor including a first electrode consisting of a single material adjacent the transistor, a second electrode remote from the transistor and a ferroelectric film therebetween;

a contact plug directly connected to the first electrode that electrically couples the ferroelectric capacitor to the source region of the integrated circuit transistor;

an insulating layer on the first and second sidewalls of the ferroelectric capacitor, the insulating layer having a surface that is substantially coplanar with an upper surface of the second electrode;

a plate line directly on the ferroelectric capacitor; and a stripe line adjacent the second electrode and remote from the first electrode.

2. A device according to claim 1, wherein the plate line is directly on the second electrode of the ferroelectric capacitor.

3. A device according to claim 1, wherein the integrated circuit ferroelectric memory device is free of a plug between the plate line and the second electrode.

4. A device according to claim 3, wherein the integrated circuit ferroelectric memory device is free of an insulating layer between the plate line and the second electrode.

5. A device according to claim 4, wherein the second electrode has a width and wherein the plate line is directly on the second electrode across the width.

6. A device according to claim 1, wherein the stripe line comprises aluminum.

7. A device according to claim 1, wherein the first electrode comprises at least one of platinum and/or iridium dioxide.

8. A device according to claim 1, wherein the ferroelectric film comprises at least one of PZT, SBT and/or BLT.

9. A device according to claim 1, wherein the second electrode comprises at least one of iridium, ruthenium, platinum and/or iridium dioxide.

* * * * *